United States Patent [19]
Rokita et al.

[11] Patent Number: 5,812,352
[45] Date of Patent: Sep. 22, 1998

[54] CIRCUIT BREAKER TESTER

[75] Inventors: Stephen R. Rokita, Sussex; John J. Davis, Little Falls, both of N.J.

[73] Assignee: Rokey Corporation, Sussex, N.J.

[21] Appl. No.: 670,647

[22] Filed: Jun. 26, 1996

[51] Int. Cl.⁶ .................................................. H02H 9/00
[52] U.S. Cl. ............................. 361/58; 361/55; 340/638
[58] Field of Search .......................... 361/54–58, 87, 361/91, 93, 97, 100–102; 324/418–424, 158 F; 340/638, 644, 652

[56] References Cited

U.S. PATENT DOCUMENTS

| | | | |
|---|---|---|---|
| 3,898,557 | 8/1975 | Strock | 324/508 |
| 4,433,293 | 2/1984 | Aoyagi et al. | 324/424 |
| 4,858,054 | 8/1989 | Franklin | 361/57 |
| 5,351,038 | 9/1994 | Goldberg | 324/424 |
| 5,422,564 | 6/1995 | Earle et al. | 324/424 |
| 5,444,377 | 8/1995 | Del Vecchio et al. | 324/424 |

*Primary Examiner*—Ronald W. Leja
*Attorney, Agent, or Firm*—Glen M. Diehl

[57] ABSTRACT

Apparatus and method for opening circuit breakers in a circuit are disclosed. The apparatus includes input terminals adapted to be connected to the circuit, a switch and a load. When the apparatus is connected to the circuit and the switch is closed, a current is created in the circuit which overloads the circuit breaker. The apparatus also includes a fuse to protect the device and a LED to indicate when the device is in use. The apparatus can also include multiple loads to be able to create the overload in different circuits.

17 Claims, 9 Drawing Sheets

CIRCUIT BREAKER TESTER

BACKGROUND OF THE INVENTION

The present invention relates generally to electrical circuitry, including circuit breakers. More particularly, it relates to method and apparatus for testing and breaking circuit breakers in electrical boxes.

Circuit breakers are an important component in electrical circuits. They are instrumental in preventing the flow of excessive current in circuits and thus, provide an important safety function. When circuit breakers malfunction, the results can be disastrous. Circuit breaker malfunctions, which are more frequent than expected, occur due to a number of reasons, such as corrosive buildups on their terminals.

Thus, it is desirable to have a convenient way to test circuit breakers. Fixtures exist to test breakers outside of the circuit in which they operate, but it is difficult to test circuit breakers once they are in place in an electrical box. Thus, new and improved apparatus and method for testing circuit breakers once they are installed in circuits are needed.

Another inconvenience associated with circuit breakers, despite their safety features, occurs when someone wants to work on an electrical circuit. Often several trips up and down stairs are needed before the circuit breaker that services the circuit being worked on can be identified. Alternatively, two persons are required to find the appropriate breaker—one at the circuit receptacles and the other at the electrical box. This represents a major inconvenience to those working on the circuits. As such, new and improved apparatus and method for locating circuit breakers are also needed.

SUMMARY OF THE INVENTION

The present invention provides apparatus and method for activating and opening a circuit breaker that is installed in a circuit. The apparatus, in accordance with a preferred embodiment of the present invention, includes two input terminals adapted to be connected to the circuit, a switch having an open and closed position and a load. The load is sufficient to create a current in the circuit which overloads the circuit breaker when the switch is closed. The apparatus also preferably includes a fuse connected in series with the hot (+) and neutral (−) input terminals, a LED and a second load connected across the first and second input terminals which draws a constant, non-overloading current from the circuit.

The apparatus can optionally include additional loads, selectable via a switch or other means, to create overload currents in a variety of circuits having different rated circuit breakers.

The apparatus further preferably includes a pulse circuit for connecting the load to the circuit for a predetermined period of time when the switch is activated and then disconnecting the load from the circuit thereafter. Additionally, the pulse circuit can periodically connect and disconnect the load from the circuit when the switch is activated.

The invention will now be further described in connection with certain illustrated embodiments; however, it should be clear to those skilled in the art that various modifications, additions and subtractions can be made without departing from the spirit and scope of the claims.

DESCRIPTION OF THE DRAWINGS

FIG. 1 illustrates the present invention;

DESCRIPTION OF THE PREFERRED EMBODIMENT

Figure 1:
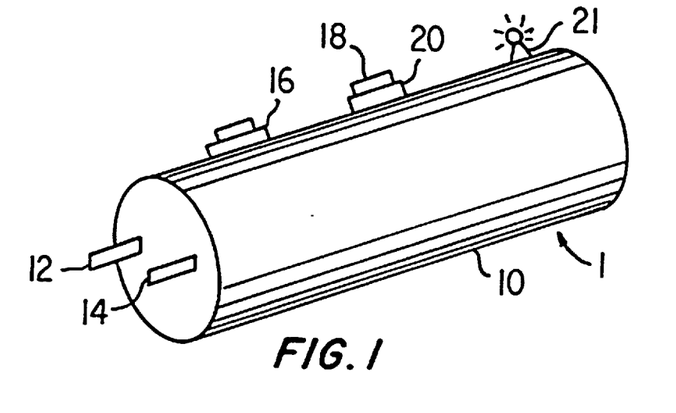

Referring to FIG. 1, a circuit breaker tester 1 in accordance with the present invention is illustrated. The device 1 can be any shape, but includes a housing 10 (a cylindrical one is shown) that has two prongs 12 and 14—which may be polarized. The plugs 12 and 14 are preferably the standard electrical plugs that insert into 120 VAC electrical sockets. They can, however, be easily changed to fit most types of electrical sockets. Additionally, adapters can be provided that allow the circuit breaker tester 1 to be inserted into most electrical sockets. Further an adapter with alligator clips can be provided to allow the circuit breaker tester 1 to be inserted into almost any circuit.

A switch 16 is provided at the top of the housing 10. The switch 16 is preferably a momentary switch and is positioned on the housing 10 in a place where an operator can conveniently place a finger or thumb to depress the switch 16. A removable fuse 18 is also provided in a fuse holder 20. Further, a LED 21 is provided to indicate when power is being supplied to the circuit in which the device 1 is inserted.

Figure 2:
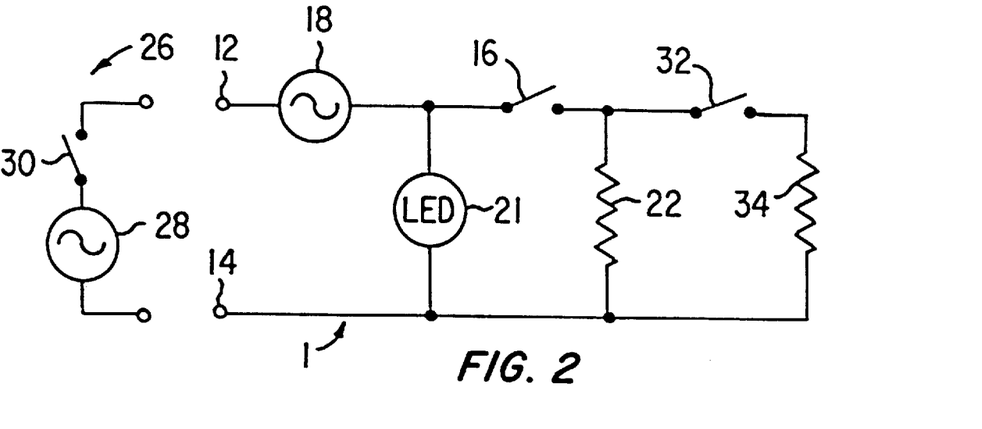
FIG. 2 is a block diagram of the circuit of the present invention.

Referring to FIG. 2, a block diagram of the circuit of the present invention is illustrated. The circuit includes the input terminals 12 and 14, the switch 16, the fuse 18, a load 22 and the LED 21. The input terminals 12 and 14 provide a means to connect the load 22 from the device 1 into a circuit 26 having a power source 28 and a circuit breaker 30 protecting the circuit 26.

The load 22 is sized to create current in the circuit 26 and in the circuit of the device 1 that will overload the circuit 26 and cause the circuit breaker 30 to open. The size of the load will depend on the rating of the circuit 26 being tested. For example, when testing a circuit rated for 15 amps, a load 22 having a resistance of approximately 4 Ω is preferred. A 4 Ω load will produce about 30 amps in the circuit 26, more than enough to open a 15 amp circuit breaker 30 in a very short time, for example, in seconds.

The load 22 can be any type of load that will produce a current in the circuit 26 that overloads the circuit breaker 30. By way of example only, the load 22 can be a resistive load or an impedance load. The load 22 may also consist of active circuitry.

When the circuit breaker tester 1 is inserted into an electrical socket, the LED 21 is lit to indicate that the circuit 26 of device 1 is inserted and is active. The fuse 18 protects the circuit 26 and the device 1 from unexpected overload situations. Thus, if the activation of the switch 16 creates the current overload in the circuit 26 and the circuit breaker 30 is defective and the momentary switch 16 sticks in the closed position, then the fuse 18 will protect the device 1 and the user of the device 1.

When the switch 16 is actuated, the load 22 is inserted across the terminals 12 and 14 and into the circuit 26. As previously described, the load 22 creates a current overload in the circuit 26. If the circuit breaker 30 in the circuit 26 is functioning properly, the circuit breaker 30 in the circuit will open.

Thus, the device 1 can be used as a tool to disable a circuit breaker before working on a circuit. For example, rather than open a circuit breaker and then test a circuit to see if it is safe to work on, then repeating the operation until the proper circuit breaker is found, the device 1 can be inserted into a circuit to open the correct circuit breaker immediately. Thus, substantial time savings can be realized though the use of the present invention.

The circuit of the circuit breaker tester 1 can also include additional loads which are switched into the circuit to enable operation in circuits having different ratings. In FIG. 2, a second load 34 and a second switch 32 are connected in parallel to the load 22. The second load 34 will generally have a different impedance than the load 22. When the user of the tester 1 wants to test a circuit having a higher rating than 15 amps, the user closes the switch 32. Then when the switch 16 is closed, the parallel combination of the loads 22 and 34 is inserted into the circuit 26.

As an example, if a circuit breaker tester 1 is being designed to test 15 A and 20 A circuits, it is preferred to utilize a 4Ω resistor for the resistor 22 and a 12Ω resistor for the resistor 34. Then when testing a 15 A, 120 VAC circuit, the switch 32 is left open and the switch 16 is actuated so that the circuit 26 sees 4Ω from the resistor 22 so that 30 A is drawn from the 15 A circuit, enough to cause the circuit breaker 30 (15 A breaker in this example) to open (or "break") the circuit.

If, however, it is desired to test a 20 A, 120 VAC circuit, then it is preferred (but probably not necessary) to close the switch 32. Then when the switch 16 is actuated, the circuit 26 sees the parallel combination of the resistances from resistors 22 and 34, which is 3Ω. Thus, the circuit 26 will attempt to deliver 40 A, which should be enough to cause the circuit breaker 30 (20 A breaker in this example) to break the circuit.

Of course, these examples are only illustrative. Any combination of resistive values can be used, depending on how much one wishes to stress the circuit 26. Further, the circuit of FIG. 2 can be generalized so that the circuit can handle any number of different amperage circuits through the use of additional loads and switches.

Figure 3:
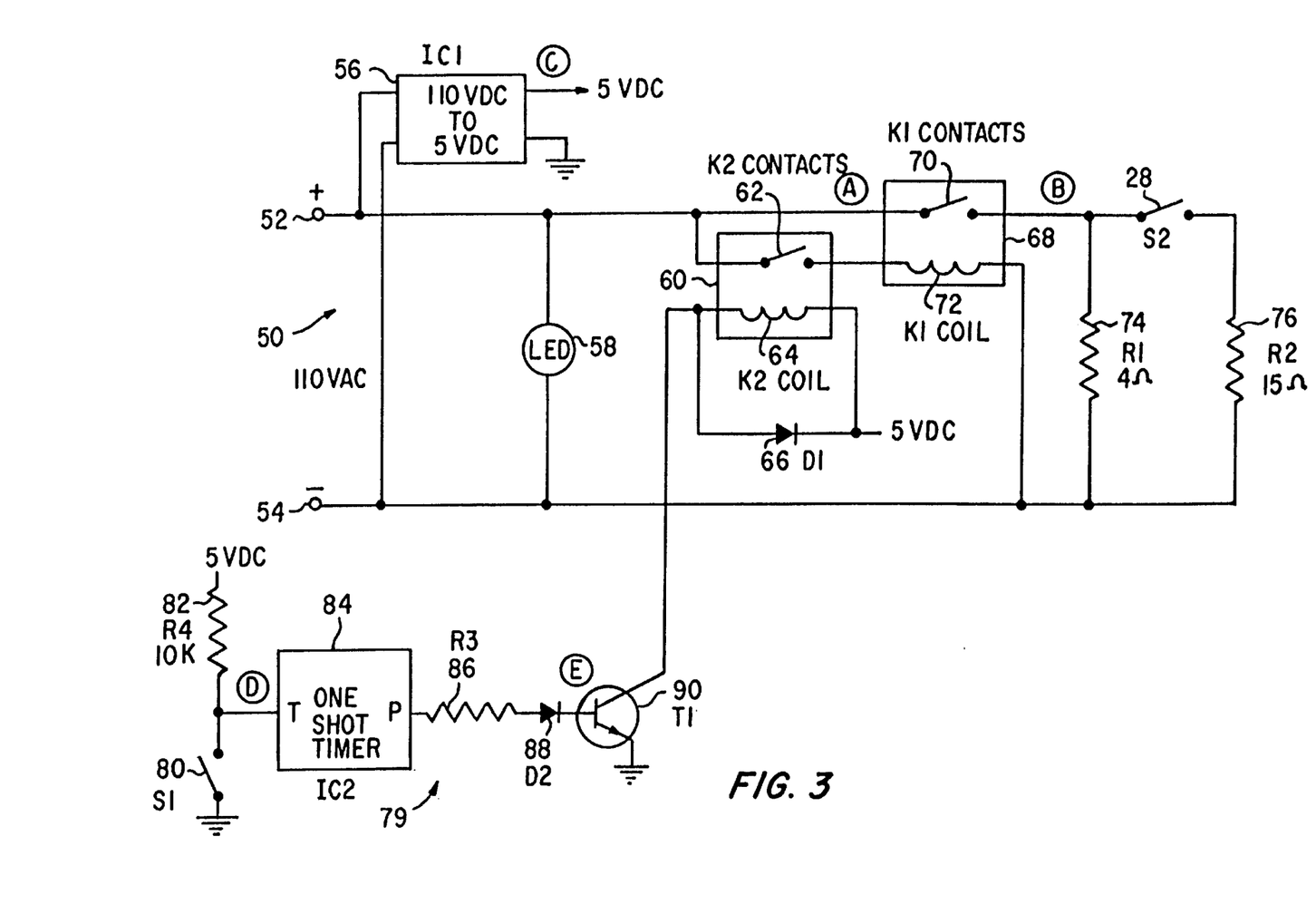
FIG. 3 shows the circuitry of the present invention in accordance with one embodiment of the present invention.

Referring now to FIG. 3, a first embodiment of a preferred circuit 50 of the circuit breaker tester 1 is illustrated. The circuit 50 includes two input terminals 52 and 54, a 110 VAC to 5 VDC converter 56, a LED 58, a 5V controlled 110 VAC rated relay 60 having contacts 62 and a coil 64, a diode 66, a 110 VAC relay 68 having contacts 70 and a coil 72, resistive loads 74 and 76 and a switch 78. The circuit 50 also includes a triggering circuit 79 that includes a switch 80, a resistor 82, a one-shot 84, a resistor 86 a diode 88 and a transistor 90.

When the circuit 50 of FIG. 3 is inserted into a wall socket or other circuit insertion point, the LED 58 is lit and 5 VDC is produced at the output of the converter 56. The 5 VDC is used to power various components in the circuit, including the one shot 84 and the transistor 90. The contacts 70 and 62 in the relays 68 and 60, respectively, are initially open so nothing else happens until the switch 80 is closed.

Figure 4:
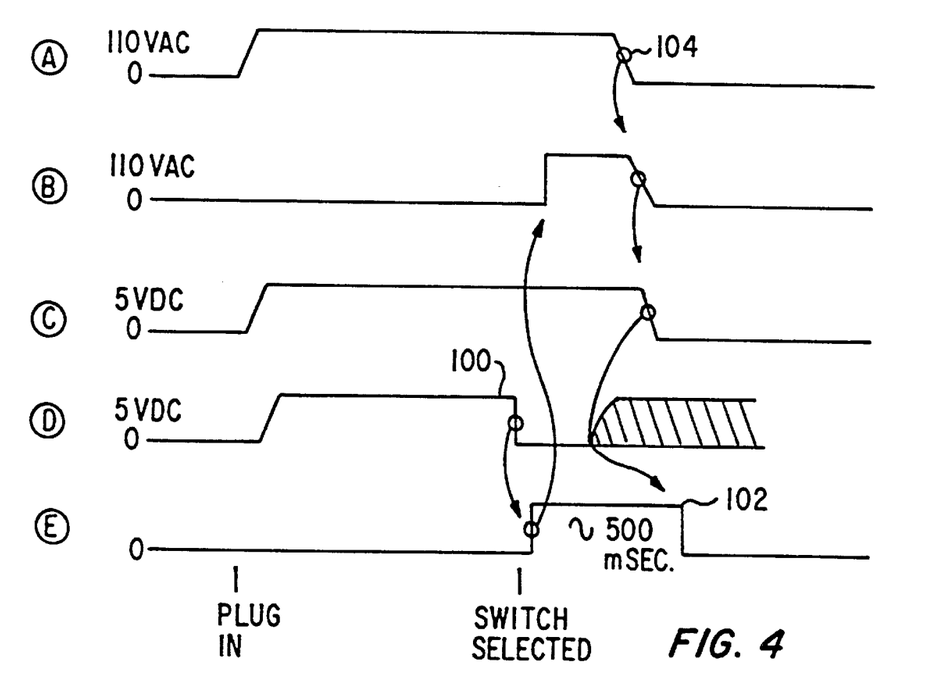
FIG. 4 is a timing diagram illustrating the operation of the circuit of FIG. 3.

The switch 80 is preferably a momentary switch. Referring to FIG. 4, when the switch 80 is closed, a negative going pulse 100 is created at point D in the circuit 50. This pulse is input into the one-shot 84 which is preferably programmed to output a 500 msec pulse 102 at point E in the circuit 50. The pulse 102 turns the transistor 90 on so that current flows through the transistor 90 from the 5 VDC source. Thus, current flows through the coil 64 of the relay 60. The current flow through the coil 64 causes the initially open contacts 62 of the relay 60 to close. Then, current flows through the coil 72 in the relay 68, causing the closure of the contacts 70 in the relay 68.

Assuming the switch 78 is open, the closure of the contacts 70 causes the resistive load 74 to be placed across the terminals 52 and 54. If the load 74 is approximately 4Ω, this will create approximately a 30 amp current in the 110 VAC circuit. Assuming the 110 VAC circuit is rated for 15 A and has a 15 A circuit breaker, this should be sufficient to cause the breaker to open in a very short time (seconds). Of course, different sized loads 74 can be used. For example, if a lower resistance is used, the current will be increased, which will not harm the circuit breaker in the circuit being tested; it will merely cause the breaker to open quicker.

When the circuit breaker opens, referring to FIGS. 3 and 4, the voltage at point A begins to fall at time 104, causing the voltage at point B to fall as well. Then, the 5 VDC output from the converter 56 falls as well at point C. If the pulsed output from the one-shot has not fallen yet, it will fall as well. Thus, the circuit 50 is ready to be reused to open another circuit breaker.

If a 20 A circuit is to be tested, then the user should throw the switch 78 closed so that the resistive load 76 is also placed in the circuit. Since the resistive load 76 is 15Ω, the combination of the loads 74 and 76 will create approximately 40 A of current. This should be sufficient to open a 20 A rated circuit breaker. Of course, as before, any number of different resistor values or different types of loads can be used to accomplish this function.

Preferred components for the circuit 50 of FIG. 3 are listed below:

| Component No. | Preferred Part No. |
|---|---|
| 56 | Circuit Part No. DPR050030-P6, available from CUI STACK |
| 60 | OMRON G5V-1-DC5 |
| 68 | OMRON G7L-1A-TUB-J-CB-AC100/120 |
| 74 | 4 Ω, 500 W resistor |
| 76 | 15 Ω, 500 W resistor |
| 84 | CMOS 555 Timer |
| 90 | General Purpose Switching Transistor, such as 2N2222 or 3904 |

Figure 5:
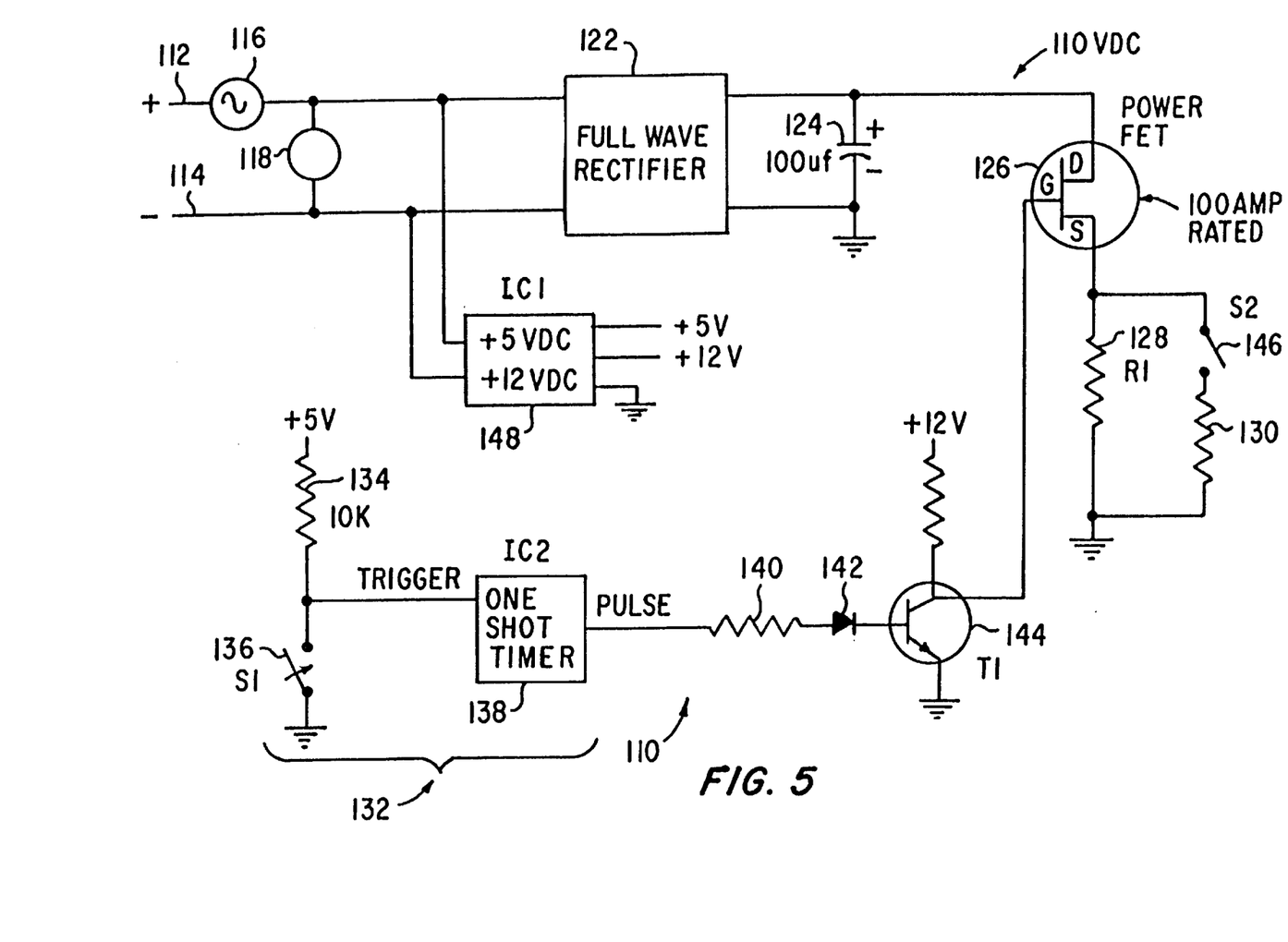
FIG. 5 shows the circuitry of the present invention in accordance with a second embodiment of the present invention.

Referring to FIG. 5, another embodiment of the present invention is illustrated. In FIG. 5, a circuit 110 is used in the same manner as previously described to open a circuit breaker that is located in a circuit. The circuit 110 includes two input terminals 112 and 114 which are adapted to be input to an existing circuit. A 40 amp, slow blow fuse 116 provides protection to the components in the circuit 110. An LED 118 provides an indication of when the circuit 110 is plugged into an energized circuit.

When the circuit 110 is plugged into an energized circuit, the voltage is supplied to a full wave rectifier 122. The 110 volt full wave rectified output from the rectifier 122 is filtered by a 100 uF capacitor 124 and then supplied to the drain of a power FET 126. The source of the power FET 126 is connected to a combination of loads 128 and 130.

A trigger circuit 132 provides an input to the gate of the FET 126 and thus controls the ON/OFF state of the FET 126. The trigger circuit 132 includes a resistor 134, a switch 136, a one-shot 138, a resistor 140, a diode 142 and a transistor 144. When the switch 136 is closed, a pulse is created that triggers the one shot 138 to create a positive pulse at its output. The positive pulse turns the transistor 144 ON, thereby causing current to flow through the transistor 144. This causes the FET 126 to be turned on. When the FET 126 turns on, the resistor 128 draws a current from the circuit that the terminals 112 and 114 are inserted in. If the resistor 128 is a 4Ω load, the circuit 110 will draw about 30 A, enough to cause a functioning circuit breaker in a 15 A circuit to open.

If the switch 146 is closed, then the resistor 130 will also draw a current from the circuit being tested. The resistor 130 can be sized to allow the circuit 110 to be used in circuits of various ratings. For example, if a 15 Ω resistor 130 is used, 40 A will be drawn—more than enough to blow a 20 A circuit breaker. The AC to DC converter 148 provides a DC voltage to various components that require a DC voltage.

Preferred components for the circuit 110 of FIG. 5 are listed below:

| Component No. | Preferred Part No. |
|---|---|
| 122 | GBPC35005-ND, a DigiKey part number, available from General Instrument |
| 126 | MTM45N15, available from Motorola |
| 128 | These loads can be implemented in many |
| 130 | different ways. For example, coil wire, 50 W resistors in parallel, etc. |
| 138 | 555 Timer |
| 144 | Any General Purpose Transistor |
| 148 | Circuit Part No. DPR050030-P6, available from CUI STACK |

Figure 6:
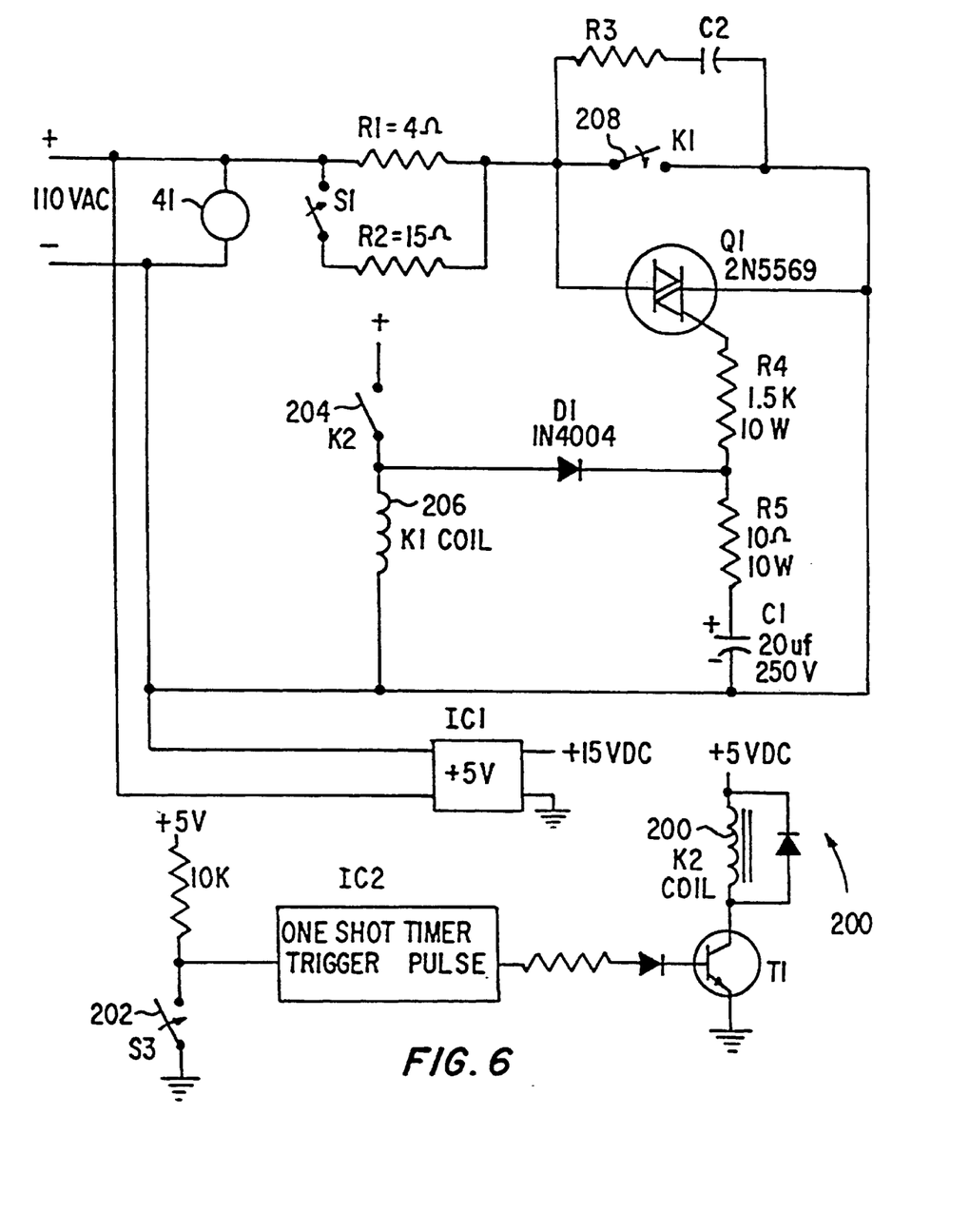
FIG. 6 shows the circuitry of the present invention in accordance with a third embodiment of the present invention.

Referring to FIG. 6, a circuit 200 in accordance with another embodiment of the present invention is shown. This circuit adds relay arcing protection that prolongs the life of the relay K1. When current flows through the coil 200 in the relay K2 due to the closing of the switch 202, the contacts 204 in the relay K2 will be closed (the K2 coil 200 and the K2 contacts 204 are operably connected, as before). This causes a current flow in the coil 206 of the relay K1 that closes the contacts 208 in the relay K1 (the K1 coil 206 and the K1 contacts 208 are also operably connected). This causes the load—R1 or the parallel combination of R1 and R2, depending on the position of switch S1—to be introduced into a circuit in which the circuit 200 is inserted. The triac Q1 will turn on as soon as sufficient gate current is present to fire it—sometime after K2 is energized—thereby diverting energy from K1 to protect the contacts.

Figure 7:
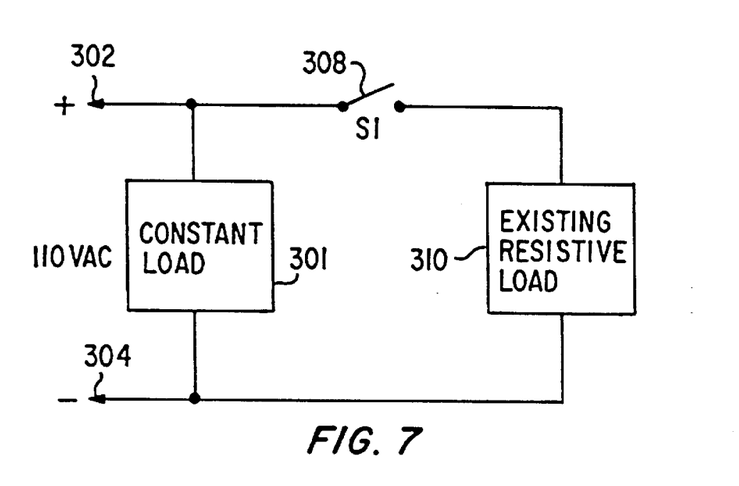
FIG. 7 shows a block diagram of the circuitry of the present invention in accordance with an alternative embodiment of the present invention.

In FIG. 7, a block diagram of a further embodiment of the present invention is illustrated. The circuit 300 of FIG. 7 includes input terminals 302 and 304, a constant load 306, a switch 308 and a resistive load 310. The constant load 306 can be any type of load, however, a resistive load of about 50Ω is preferred so that a small current is drawn from the circuit being tested. The current drawn should be well below the rating of the circuit being tested.

When the circuit 300 is plugged into an energized circuit, the constant load 306 draws a small current. The load 310 does not draw a current until the switch 308 is depressed. When the switch 308 is depressed, the load 310 will also draw a current. This current drawn due to the parallel combination of the loads 306 and 310 is preferably an overload current, sufficient to open a circuit breaker in the circuit being tested. The constant load 306 in the circuit of FIG. 7 provides more protection for the switching elements (relay) in line with the overload load, prolonging their life by decreasing the arc energy seen across the relay contacts. Of course, the constant load 306 can be inserted across the input terminals of the circuits of FIGS. 2, 3, 5 or 6.

The previous circuits either used a switch (switch 16 in FIG. 2) or a one-shot circuit (79 in FIG. 3, 138 in FIG. 5 and IC2 in FIG. 6) to activate the circuit breaker tester 1. In accordance with another preferred embodiment of the present invention, a continuous pulsing circuit can be substituted for the one-shot circuit to drive the operation of the device 1. It is believed that a continuously pulsed circuit would provide more reliability than the single shot solution. It also reduces the wattage requirement of the loads used.

Figure 8:
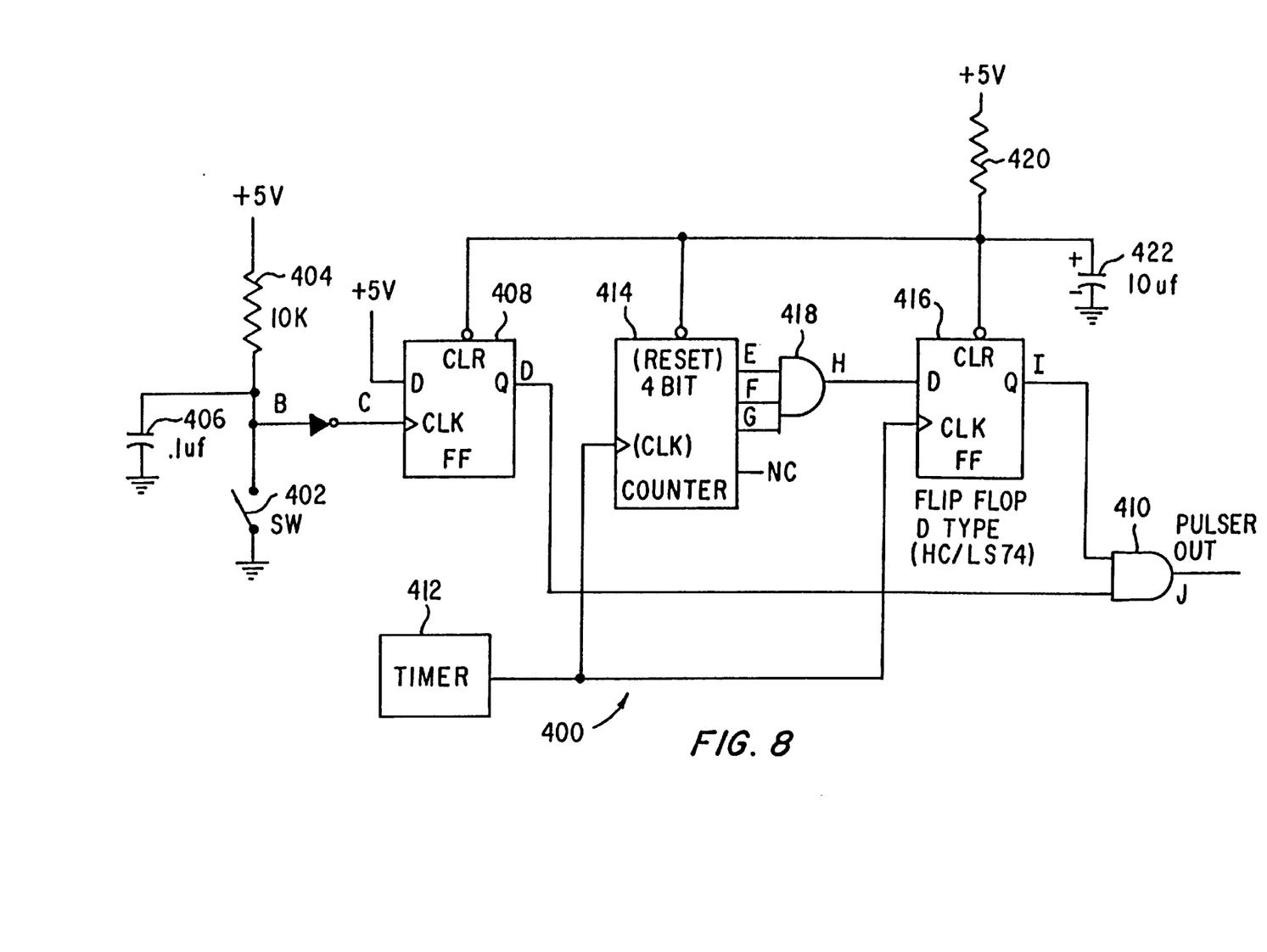
FIG. 8 shows the circuitry of the present invention in accordance with a fourth embodiment of the present invention.

Referring to FIG. 8, a preferred continuous pulsing circuit 400 is shown. The switch 402 is thrown to activate the operation of the circuit testing device. The resistor 404 and the capacitor 406 are selected to insure a minimum pulse for a digital clock input. When the switch 402 is closed, a pulse goes through a Schmidt triggered device (e.g. HC14) to the clock input of a D-type flip flop 408, setting the output Q of the flip flop 408 high. This output Q is sent to one of the inputs of an AND gate 410 to enable the output of pulses.

The timer 412 provides a periodic clock output having a period of about 500 msec. to the clock inputs of a synchronous 4 bit counter 414 and another D-type flip flop 416. The counter 414 is set up to continuously roll over (i.e., it counts from 0000 to 1111 and then back to 0000, repeating the cycle continuously). The three least significant output bits from the counter 414 are input to an AND gate 418. Thus, every eight counts, when the counter output reaches 0111 or 1111, a high pulse appears at the output of the AND gate 418. This high signal is clocked into the D-type flip flop 416 so that a high signal appears at the Q output of the flip flop 416 and at the second input of the AND gate 410. Thus, once every eight cycles of the clock from the timer 412, a pulse appears at the output of the gate 410. The resistor 420 and the capacitor 422 provide a power up reset for the devices 408, 414 and 416.

The pulse from the gate 410 is used to drive the operation of the device 1. For example, in FIG. 3, the output of the gate 410 is input to the base of the transistor 90 to continuously drive the circuit with a duty cycle of ⅛. In FIG. 5, the output of the gate 410 is input to resistor 140 and then into the base of the transistor 144. In FIG. 6, the output of the gate 410 is input to the resistor R6 and then into the base of the transistor T1.

The circuit of FIG. 8 utilizes a duty cycle of ⅛. However, if circuit loading conditions or other human factors dictate the use of other duty cycles, they can easily be implemented by changing the logic gates at the output of the counter 414.

Figure 9:
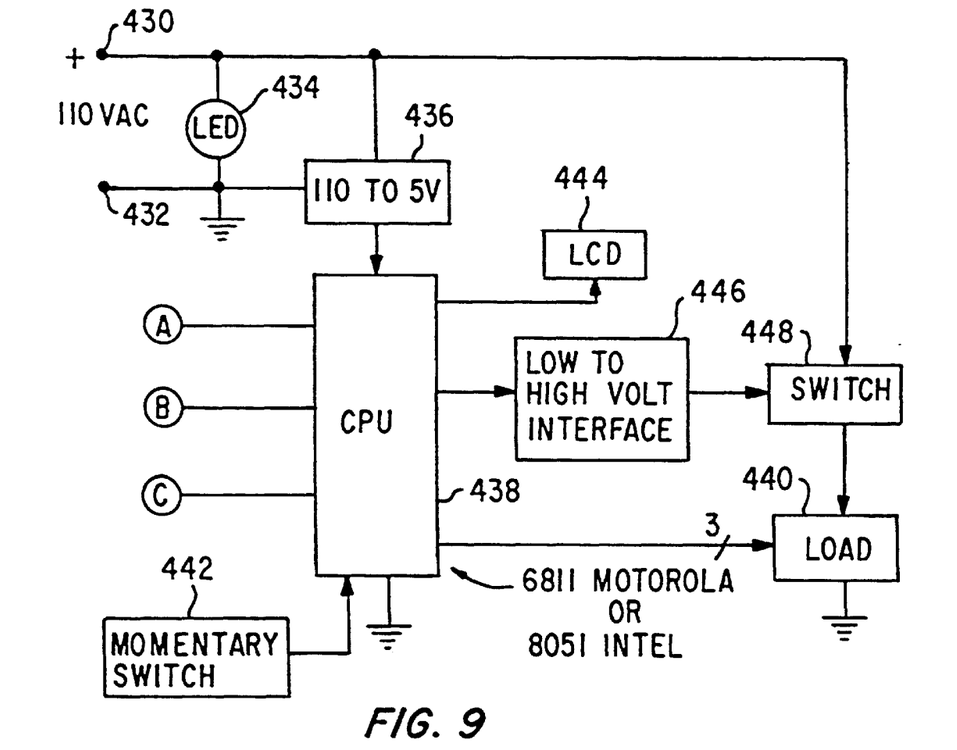
FIGS. 9, 11 and 12 illustrate a microprocessor based tester in accordance with yet another aspect of the present invention.

FIG. 9 illustrates a microcontroller based embodiment of the present invention. Input terminals 430 and 432 are adapted to be input into a 120 VAC circuit. When the terminals 430 and 432 are inserted into a circuit, the power from the circuit drives an LED 434 and an AC to DC power converter 436. The converter 436 supplies power to a microcontroller 438, which is preferably either a Motorola 6811 or an Intel 8051. The microcontroller 438 has three inputs A, B and C which are used to signal the type of circuit being tested. These inputs A to C can be driven by individual switches mounted externally on the testing device or, alternatively, a dial switch can be used. In any event, the microcontroller 438 reads these inputs to determine how to control the rest of the circuit. Depending on the status of the inputs A to C, the microcontroller 438 sets the level of three lines to a load 440.

A table showing one way of controlling the load 440 in accordance with the inputs A to C is set forth below.

| Inputs A to C | Outputs to Load | Action |
| --- | --- | --- |
| 001 | 000 | Test 15A breaker by switching in load of 4 Ω |
| 010 | 001 | Test 20A breaker by switching in load of 3 Ω |
| 011 | 002 | Test 25A breaker by switching in load of 2.3 Ω |
| 100 | 003 | Test 30A breaker by switching in load of 1.95 Ω |
| 101 | 004 | Test 50A breaker by switching in load of 1.17 Ω |
| 110 | 005 | Test 100A breaker by switching in load of 0.6 Ω |

The microcontroller 438 also receives an input from a momentary switch 442 and provides outputs to an LCD 444 and an interface circuit 446 that controls the operation of a switch 448.

Figure 10:
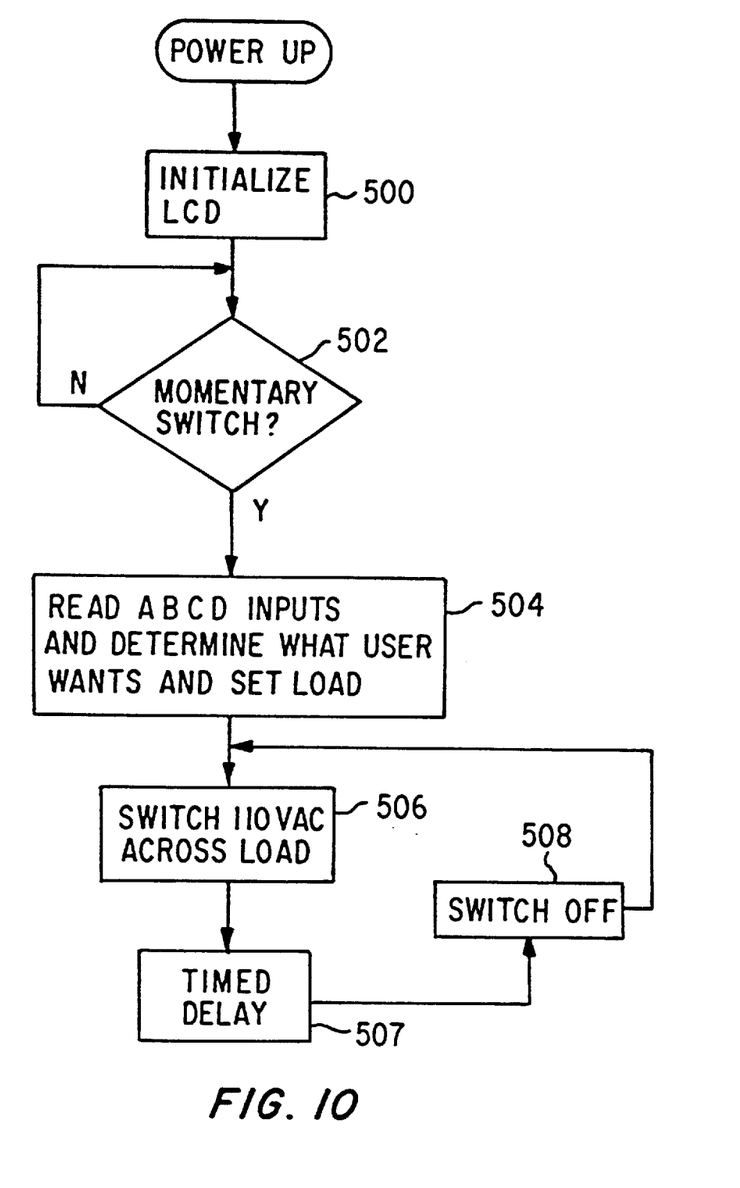
FIG. 10 illustrates the steps performed by the microprocessor in FIG. 9.

Referring now to FIG. 10, the operation of the microcontroller 438 will be explained. On power up, in step 500, the microcontroller 438 activates the LCD 444 to indicate to the user of the testing device that the circuit being tested is powered. Then, in step 502, the microcontroller 438 loops, waiting for the closure of the momentary switch 442. When the switch 442 closes, the microcontroller 438 in step 504 reads the inputs A to C to determine what the rated amperage of the circuit being tested is. Depending on the status of the inputs, the microcontroller 438 sets three bits to control the status of the load 440. The preferred loads for several selected circuits is set forth in the previous table. The LCD 444 can be used to display the type of breaker being tested.

Once the load 440 is set, the microcontroller 438, in step 506, sends a signal to the interface circuit 446. This circuit 446 creates an analog level signal from the microcontroller's 438 digital signal to drive the switch 448. The circuit 446 then causes the switch 448 to connect the load 440 to the circuit being tested, thus causing a circuit breaker to open. Then, in step 507, the microcontroller 438 loops for a predetermined length of time before turning the switch off in step 508, thereby controlling the duty cycle of the switch 448. It should be appreciated that the duty cycle can easily be controlled via an additional input to the microcontroller 438.

Figure 11:
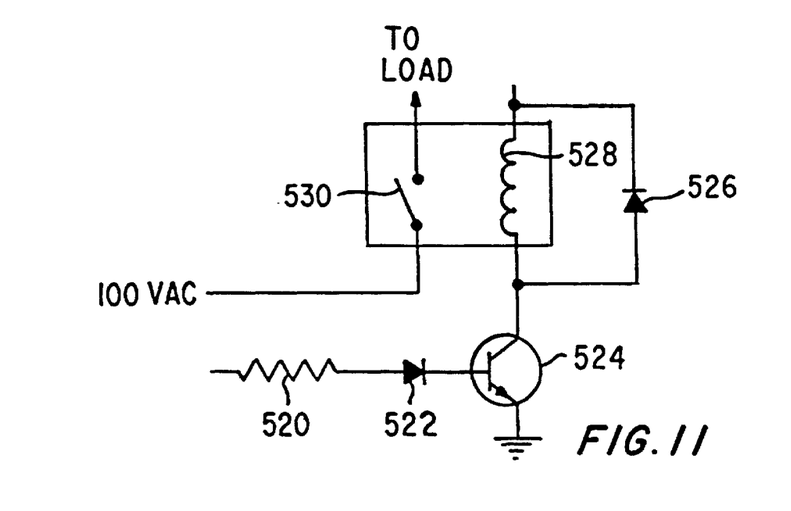

Referring to FIG. 11, the interface circuit 446 and the switch 448 are shown in greater detail. The interface circuit 446 includes a resistor 520, a diode 522, a transistor 524, a diode 526 and the coil section 528 of a relay K1. The switch circuit 448 includes the 110 VAC contacts 530 in the relay K1. The output from the microcontroller 438 is output to the resistor 520 and then to the transistor 524. When the microcontroller 438 outputs an enabling signal, current flows through the coil 528 and through the transistor 524, causing the closure of the contact 530 and thereby connecting the load. When the microcontroller 438 outputs a disabling signal, the current flow in the coil 528 ceases and the contact 530 opens, thereby disconnecting the load.

Figure 12:
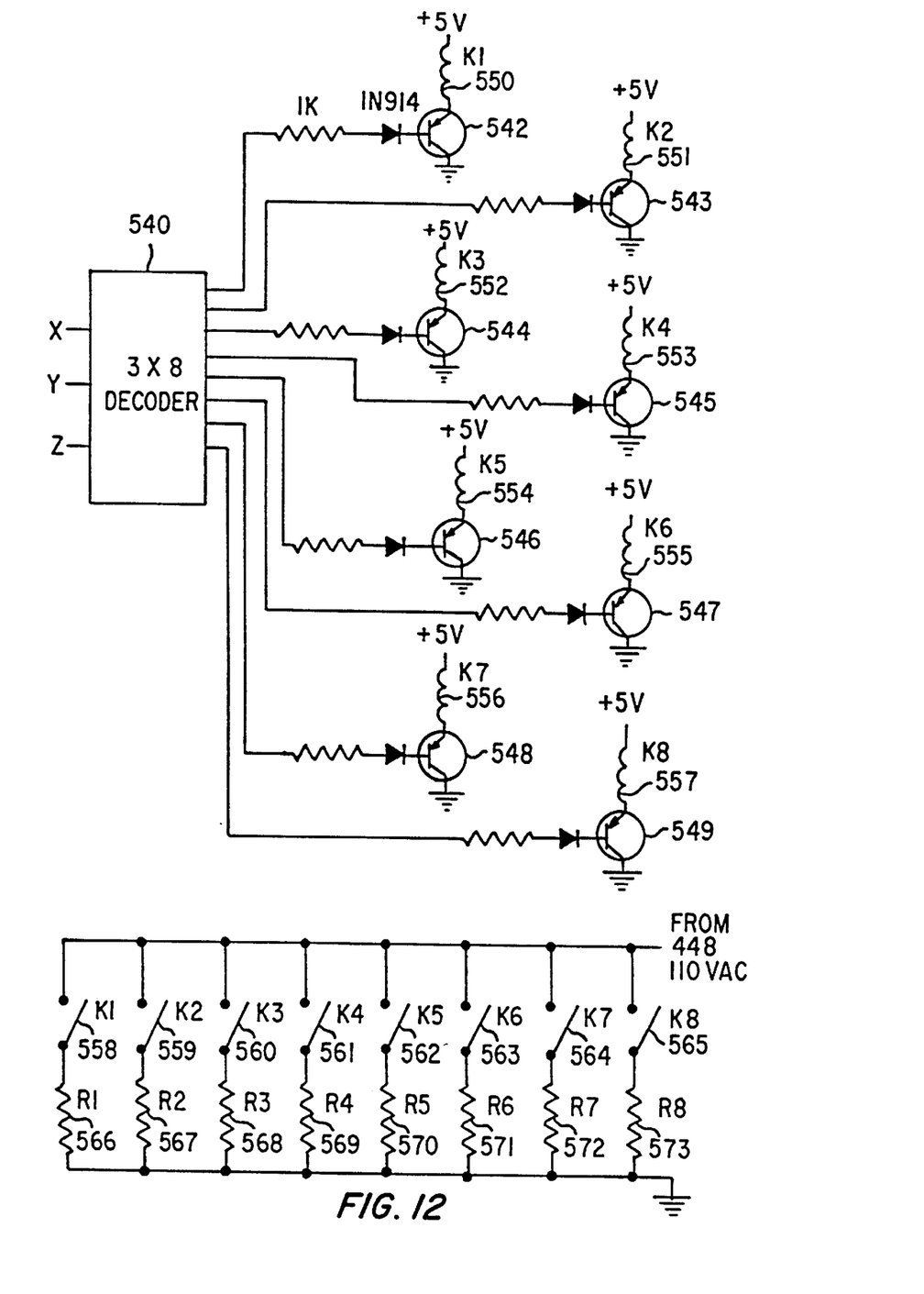

In FIG. 12, the load circuit 440 is shown in greater detail. Three outputs X, Y and Z are provided from the microcontroller 438 in accordance with the desired load. The signals X, Y and Z—which can be provided by any input device, e.g., switches, keypad, dials, etc.—are provided to a 3×8 decoder 540 which provides an output on one of eight lines, the particular output line depending on the three inputs. Each output from the decoder 540 goes through a resistor and a diode to the base of a transistor 542 to 549, respectively. Each transistor 542 to 549 has a coil 550 to 557, respectively, connected in series to its emitter junction so that when the transistor is turned on, current flows through the coil. Each coil 550 to 557 is electromagnetically associated with a contact 558 to 565, respectively, so that when current flows through the coil, the contact closes, thereby connecting a load 566 to 573. It will be appreciated by those skilled in the art that this load circuit can also be used in any of the embodiments of the present invention; it is not limited to the microcontroller based embodiment of FIG. 9.

It is understood that changes may be made in the above description without departing from the scope of the invention. It is accordingly intended that all matter contained in the above description and in the drawings be interpreted as illustrative rather than limiting.

We claim:

1. Apparatus for opening a circuit breaker in a circuit, comprising:
   first and second input terminals adapted to be connected to the circuit;
   a switch having an open position and a closed position;
   a first load sufficient to draw a current from the circuit which overloads the circuit breaker, the first load and the switch being connected in series between the first and second input terminals;
   pulse circuit means for periodically electrically connecting and disconnecting the first load to the circuit when the switch is closed;
   whereby the first load is electrically disconnected from the circuit when the switch is open and the first load is electrically connected to the circuit when the switch is closed.

2. The claim of claim 1, wherein the load is a 4Ω resistive load.

3. The claim of claim 1, further comprising:
   a fuse connected in series with the switch and the first load between the input terminals.

4. The claim of claim 1, further comprising:
   a LED connected across the first and second input terminals.

5. The claim of claim 3, further comprising:
   a LED connected across the first and second input terminals.

6. The claim of claim 1, wherein the switch is a momentary switch.

7. The claim of claim 1, further comprising:
   a second load connected across the first and second terminals in parallel with the switch and the first load, the second load being sized to draw a non-overload current from the circuit.

8. The claim of claim 1, further comprising:
   a second load connected across the first and second terminals in parallel with the switch and the first load, the second load being sized to draw a non-overload current from the circuit;
   a fuse connected in series with the input terminals and the first load; and a LED connected across the first and second input terminals.

9. The claim of claim 1, further comprising:

a second switch having an open and closed position;

a second load, the second load being connected in series with the second switch, the series connection being connected in parallel to the first load;

whereby when the second switch is closed, the second load is connected in parallel to the first load and when the switch is open, the second load is disconnected.

10. The claim of claim 1, further comprising:

a plurality of loads;

means for selectively connecting one or more of the loads to the first and second input terminals;

whereby different circuit breaker overload currents can be established.

11. A method for opening a circuit breaker in a circuit with a device having two input terminals, a load and a switch, comprising the steps of:

inserting the input terminals into the circuit;

activating the switch to electrically connect the load to the circuit, whereby the load draws a current from the circuit which overloads the circuit breaker; and periodically electrically connecting and disconnecting the load to and from the circuit when the switch is activated.

12. The claim of claim 11, further comprising the step of indicating when the device has been inserted into the circuit.

13. Apparatus for opening a circuit breaker in a circuit, comprising:

first and second input terminals adapted to be connected to the circuit;

a load connected to the first and second input terminals, the load being sized to draw a current from the circuit that overloads the circuit breaker;

switching means for electrically and periodically connecting and disconnecting the load from the first and second input terminals, whereby connection of the load causes the circuit breaker to open.

14. The claim of claim 13, wherein the switching means normally disconnects the load and activation of the switching means causes the load to be momentarily connected.

15. The claim of claim 13, further comprising:

a second load connected across the first and second terminals in parallel with the load, the second load being sized to draw a non-overload current from the circuit;

a fuse connected in series with the input terminals and the load; and a LED connected across the first and second input terminals.

16. The claim of claim 13, further comprising:

a plurality of loads;

means for selectively connecting at least one of the loads to the first and second terminals.

17. The claim of claim 13, wherein the switching means connects the load to the first and second terminals for a predetermined time period and then disconnects the load.

* * * * *